US012768922B2

(12) United States Patent
Johnson et al.

(10) Patent No.: US 12,768,922 B2
(45) Date of Patent: Oct. 20, 2026

(54) SIMULATED COMPUTER TOMOGRAPHIC IMAGING

(71) Applicant: KONINKLIJKE PHILIPS N.V., Eindhoven (NL)

(72) Inventors: Brian David Johnson, Dallas, TX (US); Ivan Dimitrov, Coppell, TX (US); Sandeep Kumar Ganji, Andover, MA (US); John Paul Penatzer, Madison, OH (US)

(73) Assignee: Koninklijke Philips N.V., Eindhoven (NL)

( * ) Notice: Subject to any disclaimer, the term of this patent is extended or adjusted under 35 U.S.C. 154(b) by 147 days.

(21) Appl. No.: 18/834,709

(22) PCT Filed: Jan. 23, 2023

(86) PCT No.: PCT/EP2023/051508
§ 371 (c)(1),
(2) Date: Jul. 31, 2024

(87) PCT Pub. No.: WO2023/148039
PCT Pub. Date: Aug. 10, 2023

(65) Prior Publication Data

US 2025/0155535 A1 May 15, 2025

Related U.S. Application Data

(60) Provisional application No. 63/305,344, filed on Feb. 1, 2022.

(30) Foreign Application Priority Data

Apr. 29, 2022 (EP) .................................... 22170875

(51) Int. Cl.
*G01R 33/56* (2006.01)
*G01R 33/48* (2006.01)

(52) U.S. Cl.
CPC ..... *G01R 33/5608* (2013.01); *G01R 33/4812* (2013.01); *G01R 33/4816* (2013.01); *G01R 33/4828* (2013.01)

(58) Field of Classification Search
CPC ............ G01R 33/5608; G01R 33/4812; G01R 33/4816; G01R 33/4828; A61B 5/055
See application file for complete search history.

(56) References Cited

U.S. PATENT DOCUMENTS

| | | | | |
|---|---|---|---|---|
| 2015/0285883 A1* | 10/2015 | Clark | ................. | G01R 33/4828 324/309 |
| 2018/0180694 A1* | 6/2018 | Sueoka | .............. | G01R 33/4816 |
| 2018/0232913 A1 | 8/2018 | Seevinck | | |

FOREIGN PATENT DOCUMENTS

| | | |
|---|---|---|
| CN | 109978965 A | 7/2019 |
| WO | 2021038053 A1 | 3/2021 |

OTHER PUBLICATIONS

International Search Report and Written Opinion from PCT/EP2023/051508 mailed Apr. 17, 2023.

(Continued)

*Primary Examiner* — Rishi R Patel

(57) ABSTRACT

Disclosed herein is a medical system (100, 500). The execution of the machine executable instructions (120) causes a computational system (104) to: receive (200) multi-echo gradient echo k-space data (122) comprising multiple in-phase groups (124) of k-space data acquired at echo times that are multiples of an interval when water and fat are in phase; reconstruct (204) a preliminary magnetic resonance image (128) for each of the group of k-space data; construct (206) an averaged magnetic resonance image (130) from the preliminary magnetic resonance images; construct (208) a temporary magnetic resonance image (132) from the preliminary magnetic resonance image with the longest echo time; construct (210) an intermediate magnetic resonance (Continued)

image (134) by subtracting the average magnetic resonance image from the temporary magnetic resonance image; construct (216) a subject mask from a reference scan magnetic resonance image (136); construct (218) a clinical magnetic resonance image (144) by setting pixels of the intermediate magnetic resonance image that are outside of the subject mask to a predetermined background value.

12 Claims, 7 Drawing Sheets

(56) References Cited

OTHER PUBLICATIONS

Kuan-Hao Su et al., / UTE-mDixon-based thorax synthetic CT generation Med. Phys. 46(8) Aug. 2019.
Andrew P. Leynes et al., / Zero-Echo-Time and Dixon Deep Pseudo-CT (ZeDD CT): Direct Generation of Pseudo-CT Images for Pelvic PET/MRI Attenuation Correction Using Deep Convolutional Neural Networks with Multiparametric MRI The Journal of Nuclear Medicine vol. 59, No. 5, May 2018.
Paul Kyu Han et al., / MR-based PET attenuation correction using a combined ultrashort echo time/multi-echo Dixon acquisition Med. Phys. 47(7) Jul. 2020.
Deininger-Czermak Eva et al: "Evaluation of ultrashort echo-time (UTE) and fast-field-echo (FRACTURE) sequences for skull bone visualization and fracture detection—A postmortem study", Journal of Neuroradiology—Journal De Neuroradiologie, vol. 49, No. 3, Nov. 7, 2021 (Nov. 7, 2021), pp. 237-243.
Johnson Brian et al: "Fast field echo resembling a CT using restricted echo-spacing (FRACTURE): a novel MRI technique with superior bone contrast", Skeletal Radiology, Springer, Berlin, De, vol. 50, No. 8, Nov. 11, 2020 (Nov. 11, 2020), pp. 1705-1713.
Zheng et al: "Magnetic Resonance-Based Automatic Air Segmentation for Generation of Synthetic Computed Tomography Scans in the Head Re", International Journal of Radiation: Oncology Biology Physics, Pergamon Press, USA, vol. 93, No. 3, Jul. 9, 2015 (Jul. 9, 2015), pp. 497-506.
Yu et al "Multiecho Water—Fat separation and simultaneous R2* estimation with multifrequency fat spectrum modeling", Magnetic Resonance in Medicine, Wiley-Liss, US, vol. 60, Oct. 27, 2008 (Oct. 27, 2008), pp. 1122-1134.
Liu et al: "Single multi-echo GRE acquisition with short and long echo spacing for simultaneous quantitative mapping of fat fraction, BO inhomogeneity, and susceptibility", Neuroimage, Elsevier, Amsterdam, NL, vol. 172, Feb. 13, 2018 (Feb. 13, 2018), pp. 703-717.
Veronique Fortier, Ives R. Levesque: "Pseudo-CT generation from 3D multi-echo gradient-echo MRI", International Society for Magnetic Resonance in Medicine, Ismrm, 2030 Addison Street, 7th Floor, Berkeley, CA 94704 USA, No. 2829, Jun. 1, 2018 (Jun. 1, 2018).
Cho, et al. (2019). Clinical Feasibility of Zero TE Skull MRI in Patients with Head Trauma in Comparison with CT: A Single-Center Study. American Journal of Neuroradiology, 40(1), 109-115.
Dremmen,, et al. (2017). Does the Addition of a "Black Bone" Sequence to a Fast Multisequence Trauma MR Protocol Allow MRI to Replace CT after Traumatic Brain Injury in Children?. American Journal of Neuroradiology, 38(11), 2187-2192.
Demehri, S., et al. (2017). Advanced imaging of glenohumeral instability: the role of MRI and MDCT in providing what clinicians need to know. Emergency radiology, 24(1), 95-103.
ECR 2018 / C-2792 / The role of susceptibility weighted imaging (SWI) in musculoskeletal radiology as an alternative to computed tomography (CT). Proc. Intl. Soc. Mag. Reson. Med. 26 (2018).
Tao, H., et al. (2018). Quantitative T2-Mapping and T2-Mapping Evaluation of Changes in Cartilage Matrix after Acute Anterior Cruciate Ligament Rupture and the Correlation between the Results of Both Methods. BioMed research international, 2018.
Gascho D, Zoelch N, Tappero C, et al. FRACTURE MRI: Optimized 3D multi-echo in-phase sequence for bone damage assessment in craniocerebral gunshot injuries. Diagnostic and Interventional Imaging. 2020.

* cited by examiner

144'

SIMULATED COMPUTER TOMOGRAPHIC IMAGING

CROSS REFERENCE TO RELATED APPLICATIONS

This application is a U.S. national phase application of International Application No. PCT/EP2023/051508 filed on Jan. 23, 2023, which claims the benefit of U.S. Application Ser. No. 63/305,344 filed on Feb. 1, 2022 and EP Application Serial No. 22170875.3 filed on Apr. 29, 2022 and is incorporated herein by reference.

TECHNICAL FIELD

The invention relates to magnetic resonance imaging, in particular to the simulation of computed tomography images using magnetic resonance imaging.

BACKGROUND

Various tomographic medical imaging techniques such as Magnetic Resonance Imaging (MRI), Computed Tomography (CT), Positron Emission Tomography, and Single Photon Emission Tomography enable detailed visualization of anatomical structure of a subject. The various imaging modalities are able to image various types of tissue and have different advantages and disadvantages. For example, CT is able to image hard tissues such as bone extremely well, but it has the disadvantage that the subject is exposed to ionizing radiation. Magnetic resonance imaging (MRI) works particularly well in imaging soft tissues and does not expose the subject to ionizing radiation. However, CT is typically able to image such things as fractures much better than MRI is.

International publication WO2021038053 discloses a medical system comprising a processor configured for controlling the medical system and a memory for storing machine executable instructions. Execution of the instructions causes the processor to receive four-dimensional Dixon magnetic resonance image data. The four-dimensional Dixon magnetic resonance imaging data is T1 weighted. The four-dimensional Dixon magnetic resonance image data is synchronized to a respiratory signal. Execution of the instructions further causes the processor to reconstruct synthetic four-dimensional computed tomographic image data from the four-dimensional Dixon magnetic resonance imaging data. The four-dimensional Dixon magnetic resonance imaging data is synchronized to the respiratory signal.

DEININGER-CZERMAK EVA ET AL: "Evaluation of ultrashort echo-time (UTE) and fast-field-echo (FRACTURE) sequences for skull bone visualization and fracture detection-A postmortem study", JOURNAL OF NEURORADIOLOGY, JOURNAL DE NEURORADIOLOGIE, vol. 49, no. 3, 7 Nov. 2021 (2021-11-07), pages 237-243, describes a study aimed to evaluate UTE and FRACTURE, two specific bone imaging MRI sequences for their ability to detect fractures of the skull vault, base, and viscerocranium using CT as the reference standard.

JOHNSON BRIAN ET AL: "Fast field echo resembling a CT using restricted echo-spacing (FRACTURE): a novel MRI technique with superior bone contrast", SKELETAL RADIOLOGY, SPRINGER, BERLIN, DE, vol. 50, no. 8, 11 Nov. 2020 (2020-11-11), pages 1705-1713, describes FRACTURE, a 3D gradient echo pulse sequence with restricted echo-spacing combined with an automated post-processing. Cases demonstrating the application and utility of this technique in diagnostic MRI performed for traumatic, inflammatory, neoplastic, and developmental conditions in pediatric patients are presented.

ZHENG WEILi ET AL: "Magnetic Resonance-Based Automatic Air Segmentation for Generation of Synthetic Computed Tomography Scans in the Head Region", INTERNATIONAL JOURNAL OF RADIATION: ONCOLOGY BIOLOGY PHYSICS, PERGAMON PRESS, USA, vol. 93, no. 3, 9 Jul. 2015 (2015-07-09), pages 497-506, introduces a hybrid phase/magnitude ultrashort echo time image processing technique to facilitate air segmentation.

YU H ET AL: "Multiecho water-fat separation and simultaneous R2* estimation with multifrequency fat spectrum modeling", MAGNETIC RESONANCE IN MEDICINE, WILEY-LISS, US, vol. 60, 27 Oct. 2008 (2008-10-27), pages 1122-1134, describes including a multifrequency model of fat in the iterative decomposition of water and fat with echo asymmetry and least-squares estimation (IDEAL) water-fat separation and simultaneous T*2 estimation techniques.

LIU JUNMIN ET AL: "Single multi-echo GRE acquisition with short and long echo spacing for simultaneous quantitative mapping of fat fraction, BO inhomogeneity, and susceptibility", NEUROIMAGE, ELSEVIER, AMSTERDAM, NL, vol. 172, 13 Feb. 2018 (2018-02-13), pages 703-717, describes work aiming to extend multi-echo gradient echo-based techniques for imaging whole head.

SUMMARY

The invention provides for a medical system, a computer program product, and a method in the independent claims. Embodiments are given in the dependent claims.

As was mentioned above, a disadvantage of MRI over CT is that CT is typically able to image fractures much better than MRI is. MRI techniques for imaging bone tissue, such as ultrashort echo time (UTE) do exist. However, these techniques often require long imaging times and it is typically more difficult to obtain quality images in a clinical setting. Embodiments may provide a means of imaging bone tissue using conventional MRI imaging techniques so that details in bone tissue are able to be examined. It may also enable the use of standard imaging processing algorithms intended for processing computed tomography images on these MRI images.

This may possibly be achieved by acquiring different in-phase groups of multi-echo gradient echo k-space data for a field of view of a subject. Each of these in-phase groups is acquired at a distinct echo time. Each of these echo times is a multiple of the interval of when the water and fat are in phase. The phase of the MR signal from water and fat is different. In Dixon imaging, this is used to produce separate water and fat images. Each of these groups of k-space data are used to reconstruct a preliminary magnetic resonance image. In examples provided herein, the multiple in-phase groups of k-space data are acquired so that the water and fat in phase. Since the water and fat are in phase, there is no dropout of signal from either water or fat. The images are therefore more similar to an X-ray or a CT image.

The preliminary magnetic resonance images are then averaged. All of the images can be averaged, or a majority of them can be averaged. Next, a temporary magnetic resonance image is constructed. The temporary magnetic resonance image is constructed from the images with the longest echo times. Typically, the temporary magnetic resonance image is identical with the preliminary magnetic resonance image that has the longest echo time. The temporary magnetic resonance image may also be an average of several of the preliminary magnetic resonance images with the longest echo time.

An intermediate magnetic resonance image is then constructed by subtracting the average magnetic resonance image from the temporary magnetic resonance image. This then results in a magnetic resonance image that is very similar to a CT image and shows details of bone structure and fractures without using ultrashort echo time imaging techniques. Because the intermediate MR image was reconstructed by subtracting the average magnetic resonance image from the temporary magnetic resonance image, the background is extremely bright and opposite from what one would expect from a CT image. This may be disorienting for radiologist and may prevent CT algorithms such as segmentation algorithms and radiation therapy planning algorithms from functioning.

Examples additionally provides for receiving reference scan k-space data. The reference scan k-space data my for example be coil calibration measurements for calibrating a parallel imaging technique or may be survey or scout scan data. In any case, the reference scan k-space data is used to construct a reference scan magnetic resonance image which is descriptive of the field of view. Standard image segmentation techniques can be applied to the reference scan magnetic resonance image to make a mask which may be used to identify which voxels of the intermediate magnetic resonance image show the subject and which voxels are background voxels. The background voxels may then set to a predetermined background value, such as a zero or null value to correct the background. This then results in a clinical magnetic resonance image which effectively images bone tissue and which may possibly be used by algorithms intended for processing CT images.

In one aspect the invention provides for a medical system that comprises a memory storing machine-executable instructions. The medical system further comprises a computational system. Execution of the machine-executable instructions causes the computational system to receive multi-echo gradient echo k-space data descriptive of a field of view of a subject. The multi-echo gradient echo k-space data is divided into multiple in-phase groups of k-space data acquired at echo times that are multiples of an interval of when water and fat are in-phase. Execution of the machine-executable instructions further causes the computational system to receive reference scan k-space data descriptive of the field of view of the subject. The reference scan k-space data could for example be k-space data that is acquired for doing a scout or reference scan. In other examples the reference scan k-space data may be k-space data that is acquired to calibrate a parallel imaging technique. For example, the reference scan k-space data could be used for determining the coil weightings of a multi-coil antenna system.

Execution of the machine-executable instructions further causes the computational system to reconstruct a preliminary magnetic resonance image for each of the multiple in-phase groups of k-space data. Execution of the machine-executable instructions further causes the computational system to construct an averaged magnetic resonance image by averaging at least half of the preliminary magnetic resonance images. Execution of the machine-executable instructions further causes the computational system to construct a temporary magnetic resonance image by using the preliminary magnetic resonance image with the longest echo time or by averaging less than half of the preliminary magnetic resonance images with the longest echo time. Execution of the machine-executable instructions further causes the computational system to construct an intermediate magnetic resonance image by subtracting the average magnetic resonance image from the temporary magnetic resonance image.

Execution of the machine-executable instructions further causes the computational system to reconstruct a reference scan magnetic resonance image from the reference scan k-space data. Execution of the machine-executable instructions further causes the computational system to co-register the reference scan magnetic resonance image to the intermediate magnetic resonance image. For example, the reference scan magnetic resonance image may be a lower resolution scout or survey image. The co-registration could for example be done using standard algorithms for registering magnetic resonance images to each other. Execution of the machine-executable instructions further causes the computational system to construct a subject mask for the field of view from the reference scan magnetic resonance image. The subject mask may for example be used to identify portions of the field of view which are outside of the subject. Because of the co-registration, this then informs what portions of the intermediate magnetic resonance image show the subject and which portions of that image are imaging free space.

Execution of the machine-executable instructions further causes the computational system to construct a clinical magnetic resonance image by setting pixels of the intermediate magnetic resonance image that are outside of the subject mask to a predetermined background value. This embodiment may be beneficial because when the intermediate magnetic resonance image is reconstructed it has the appearance and many properties of a CT image. However, during the process of the subtraction, the regions of the image that are outside of the subject have a high pixel value as opposed to a predetermined background value such as a low or zero value. The intermediate magnetic resonance image by itself then does not have the appearance of a CT image. The clinical magnetic resonance image however has had these pixels set to the predetermined background value. In this case the clinical magnetic resonance image does have the appearance of a CT image, although the image data has been acquired using a magnetic resonance imaging system. A huge benefit is that often times the clinical magnetic resonance image may be used in algorithms that are used for processing CT images. For example, for doing such things as radiation dose therapy planning, using segmentation algorithms, or constructing pseudo computed tomography images.

In another embodiment execution of the machine-executable instructions further causes the computational system to input the clinical magnetic resonance image into a computed tomography image processing algorithm. Examples of a computed tomography image processing algorithm include a computed tomography segmentation algorithm, a computed tomography radiotherapy planning algorithm, and a pseudo computed tomography reconstruction algorithm. For example, the clinical magnetic resonance image could be used as a starting point to produce a pseudo computed tomography image. Additional information from for example, T2-star maps or from segmentations of one or more of the preliminary magnetic resonance images may be used to improve the pseudo computed tomography image.

In another embodiment the multi-echo gradient echo k-space data further comprises at least one Dixon group of k-space data acquired at an echo time according to a Dixon magnetic resonance imaging protocol. Execution of the machine-executable instructions further causes the computational system to calculate one or more Dixon images of the field of view from the at least one Dixon group of k-space data and a portion of the multiple in-phase groups of k-space data. The one or more Dixon images comprise one or more of the following: an in-phase Dixon image, an out-of-phase Dixon image, a fat image, a water image, a fat fraction image or map, a water fraction image or map, a T2-star map, and an R2-star map.

In another embodiment the Dixon magnetic resonance imaging protocol is a multi-point Dixon magnetic resonance imaging protocol. Execution of the machine-executable instructions further causes the computational system to calculate a B0 map for the field of view during calculation of the one or more Dixon images. When performing Dixon magnetic resonance imaging there are different techniques or protocols which can be used. If a so-called two-point Dixon magnetic resonance imaging protocol is used two data points are required and in order to calculate things accurately a B0 map of the field of view may be needed to calculate the values correctly. If more than points or two measurements are made, then this is a multi-point Dixon magnetic resonance imaging protocol and within these protocols there exists methods for determining the B0 map without measuring it directly.

In another embodiment the Dixon magnetic resonance imaging protocol is a two-point Dixon magnetic resonance imaging protocol. Execution of the machine-executable instructions further causes the computational system to receive a B0 map of the field of view. One or more Dixon images are further calculated using the B0 map.

In another embodiment execution of the machine-executable instructions further causes the computational system to calculate a T2 map from the T2-star map and the B0 map. The T2-star map is a mapping which measures the de-phasing of the MR signal. This de-phasing may be due to inhomogeneities in the B0 field as well as the T2 value within different regions of the subject. By knowing the B0 map, the T2 map can be calculated from the T2-star map.

In another embodiment execution of the machine-executable instructions further causes the computational system to calculate a cartilage map for the field of view by segmenting the T2 map. This embodiment may be beneficial because details of the cartilage of the subject may be particularly able to be determined or segmented using the T2 map. The segmentation of the T2 map to make the cartilage map may for example be useful for making a pseudo computed tomography image or by adding additional detail to the clinical magnetic resonance image. This may make the clinical magnetic resonance image more CT image-like.

In another embodiment the medical system further comprises a magnetic resonance imaging system. The memory further contains multiple-echo pulse sequence commands configured to control the magnetic resonance imaging system to acquire the multi-echo gradient echo k-space data. The memory further contains reference scan pulse sequence commands configured to control the magnetic resonance imaging system to acquire the reference scan k-space data. Execution of the machine-executable instructions further causes the computational system to control the magnetic resonance imaging system with the pulse sequence commands to acquire multi-echo gradient echo k-space data. Execution of the machine-executable instructions further causes the computational system to control the magnetic resonance imaging system with the reference scan pulse sequence commands to acquire the reference scan k-space data.

In another embodiment the multiple-echo pulse sequence commands cause the magnetic resonance imaging system to generate flyback magnetic field gradients or bipolar magnetic field gradients to ensure that each part of the multi-echo gradient echo k-space data is acquired with an identical readout polarity. This may be beneficial because it may provide for preliminary magnetic resonance images that are more uniform.

The use of the flyback magnetic field gradients or the bipolar magnetic field gradients may also be used when acquiring the at least one Dixon group of k-space data.

In another embodiment the multi-echo pulse sequence commands are gradient echo pulse sequence commands configured to control the magnetic resonance imaging system to acquire the multi-echo gradient echo k-space data at echo times that are multiples of the interval when fat and water are in-phase.

In another embodiment the multiple-echo pulse sequence commands are further configured to additionally control the magnetic resonance imaging system to acquire the multi-echo gradient echo k-space data such that it comprises the at least one Dixon group of k-space data.

In another aspect the invention provides for a computer program product that comprises machine-executable instructions for execution by a computational system. Execution of the machine executable instructions causes the computational system to receive multi-echo gradient echo k-space data descriptive of a field of view of a subject. The multi-echo gradient echo k-space data are multiple in-phase groups of k-space data acquired at echo times that are multiples of an interval when the water and fat are in-phase. Execution of the machine-executable instructions further causes the computational system to receive reference scan k-space data descriptive of the field of view of the subject. Execution of the machine-executable instructions further causes the computational system to reconstruct a preliminary magnetic resonance image for each of the multiple in-phase groups of k-space data.

Execution of the machine-executable instructions further causes the computational system to construct an average magnetic resonance image by averaging at least half of the preliminary magnetic resonance images. Execution of the machine-executable instructions further causes the computational system to construct a temporary magnetic resonance image by using the preliminary magnetic resonance image with the longest echo time or by averaging less than half of the preliminary magnetic resonance images. Execution of the machine-executable instructions further causes the computational system to construct an intermediate magnetic resonance image by subtracting the average magnetic resonance image from the temporary magnetic resonance image. Execution of the machine-executable instructions further causes the computational system to reconstruct a reference scan magnetic resonance image from the reference scan k-space data.

Execution of the machine-executable instructions further causes the computational system to co-register the reference scan magnetic resonance image to the intermediate magnetic resonance image. Execution of the machine-executable instructions further causes the computational system to construct a subject mask for the field of view from the reference scan magnetic resonance image. Execution of the machine-executable instructions further causes the computational system to construct a clinical magnetic resonance image by setting pixels of the intermediate magnetic resonance image that are outside the subject mask to a predetermined background value.

In another aspect the invention provides for a method of medical imaging. The method comprises receiving multi-echo gradient echo k-space data descriptive of a field of view of a subject. The multi-echo gradient echo k-space data are in multiple in-phase groups of k-space data that are acquired at echo times that are multiples of an interval when both the water and fat are in-phase. The method further comprises receiving reference scan k-space data descriptive of the field of view of a subject. The method further comprises reconstructing a preliminary magnetic resonance image for each of the multiple in-phase groups of k-space data. The method further comprises constructing an average magnetic resonance image by averaging at least half of the preliminary magnetic resonance images. The method further comprises constructing a temporary magnetic resonance image by using the preliminary magnetic resonance image with the longest echo time or by averaging less than half of the preliminary magnetic resonance images.

The method further comprises constructing an intermediate magnetic resonance image by subtracting the average magnetic resonance image from the temporary magnetic resonance image. The method further comprises reconstructing a reference scan magnetic resonance image from the reference scan k-space data. The method further comprises co-registering the reference scan magnetic resonance image to the intermediate magnetic resonance image. The method further comprises constructing a subject mask for the field of view from the reference scan magnetic resonance image. The method further comprises constructing a clinical magnetic resonance image by setting pixels of the intermediate magnetic resonance image that are outside of the subject mask to a predetermined background value.

In another aspect the invention provides for a medical system that comprises a memory storing machine-executable instructions. The medical system further comprises a computational system. Execution of the machine-executable instructions causes the computational system to receive multi-echo gradient echo k-space data descriptive of a field of view of a subject. The multi-echo gradient echo k-space data comprises multiple in-phase groups of k-space data that is acquired at echo times that are multiples of an interval where the water and fat are in-phase. The multi-echo gradient echo k-space data further comprises at least one Dixon group of k-space data that is acquired at an echo time according to a Dixon magnetic resonance imaging protocol.

Execution of the machine-executable instructions further causes the computational system to calculate one or more Dixon images of the field of view from the at least one Dixon group of k-space data and a portion of the multiple in-phase groups of k-space data. The one or more Dixon images comprise one or more of the following: an in-phase Dixon image, an out of phase Dixon image, a fat image, a water image, a fat fraction image or map, a water fraction image or map, a T2-star map, and an R2-star map. Execution of the machine-executable instructions further causes the computational system to reconstruct a preliminary magnetic resonance image for each of the multiple in-phase groups of k-space data. Execution of the machine-executable instructions further causes the computational system to construct an average magnetic resonance image by averaging at least half of the preliminary magnetic resonance images. Execution of the machine-executable instructions further causes the computational system to construct a temporary magnetic resonance image by using the preliminary magnetic resonance image with the longest echo time or by averaging at least half of the preliminary magnetic resonance images, preferably those with the longest echo times. Execution of the machine-executable instructions further causes the computational system to construct an intermediate magnetic resonance image by subtracting the average magnetic resonance image from the temporary magnetic resonance image.

In another embodiment execution of the machine-executable instructions further causes the computational system to receive reference scan k-space data descriptive of the field of view of the subject. Execution of the machine-executable instructions further causes the computational system to reconstruct a reference scan magnetic resonance image from the reference scan k-space data. Execution of the machine-executable instructions further causes the computational system to co-register the reference scan magnetic resonance image to the intermediate magnetic resonance image. Execution of the machine-executable instructions further causes the computational system to construct a subject mask for the field of view from the reference scan magnetic resonance image. Execution of the machine-executable instructions further causes the computational system to construct a clinical magnetic resonance image by setting pixels of the intermediate magnetic resonance image that are outside of the subject mask to a predetermined background value.

In another embodiment the medical system further comprises a magnetic resonance imaging system. The memory further contains multi-echo pulse sequence commands configured to control the magnetic resonance imaging system to acquire the multi-echo gradient echo k-space data. The multiple-echo pulse sequence commands are further configured to additionally control the magnetic resonance imaging system to acquire the multi-echo gradient echo k-space data such that it comprises the at least one Dixon group of k-space data. Execution of the machine-executable instructions further causes the computational system to control the magnetic resonance imaging system with the pulse sequence commands to acquire multi-echo gradient echo k-space data. Execution of the machine-executable instructions further causes the computational system to control the magnetic resonance imaging system with the reference scan pulse sequence commands to acquire the reference scan k-space data. In another embodiment the memory further contains reference scan pulse sequence commands configured to control the magnetic resonance imaging system to acquire the reference scan k-space data.

In another aspect the invention provides for a computer program product that comprises machine-executable instructions for execution by a computational system. Execution of the machine-executable instructions causes the computational system to receive multi-echo gradient echo k-space data descriptive of a field of view of the subject. The multi-echo gradient echo k-space data comprises multiple in-phase groups of k-space data acquired at echo times that are multiples of an interval when both the water and fat are in-phase. The multi-echo gradient echo k-space data further comprises at least one Dixon group of k-space data acquired at an echo time according to a Dixon magnetic resonance imaging protocol.

Execution of the machine-executable instructions further causes the computational system to calculate one or more Dixon images of the field of view from the at least one Dixon group of k-space data and a portion of the multiple in-phase groups of k-space data. The one or more Dixon images comprises one or more of the following: an in-phase Dixon image, an out-of-phase Dixon image, a fat image, a water image, a fat fraction image or map, a water fraction image or map, a T2-star map, and an R2-star map. Execution of the machine-executable instructions further causes the computational system to reconstruct a preliminary magnetic resonance image for each of the multiple in-phase groups of k-space data. Execution of the machine-executable instructions further causes the computational system to construct an average magnetic resonance image by averaging at least half of the preliminary magnetic resonance images. Execution of the machine-executable instructions further causes the computational system to construct a temporary magnetic resonance image by using the preliminary magnetic resonance image with the longest echo time or by averaging less than half of the preliminary magnetic resonance images. Execution of the machine-executable instructions further causes the computational system to construct an intermediate magnetic resonance image by subtracting the average magnetic resonance image from the temporary magnetic resonance image.

In another aspect the invention provides for a method of medical imaging. The method comprises receiving multi-echo gradient echo k-space data descriptive of a field of view of the subject. The multi-echo gradient echo k-space data comprises multiple in-phase groups of k-space data acquired at echo times that are multiples of an interval where the water and fat are in phase. The multiple-echo gradient echo k-space data further comprises at least one Dixon group of k-space data acquired at an echo time according to a Dixon magnetic resonance imaging protocol. The method further comprises calculating one or more Dixon images of the field of view from the at least one Dixon group of k-space data and a portion of the multiple in-phase groups of k-space data where the one or more Dixon images comprises one or more of the following: an in-phase Dixon image, an out-of-phase Dixon image, a fat image, a water image, a fat fraction image, a water fraction image, a T2-star map, and an R2-star map.

The method further comprises reconstructing a preliminary magnetic resonance image for each of the multiple in-phase groups of k-space data. The method further comprises constructing an averaged magnetic resonance image by averaging at least half of the preliminary magnetic resonance images. The method further comprises constructing a temporary magnetic resonance image by using the preliminary magnetic resonance image with the longest echo time or by averaging less than half of the preliminary magnetic resonance images. The method further comprises constructing an intermediate magnetic resonance image by subtracting the average magnetic resonance image from the temporary magnetic resonance image.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a computational system of a general purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Medical imaging data is defined herein as being recorded measurements made by a tomographic medical imaging system descriptive of a subject. The medical imaging data may be reconstructed into a medical image. A medical image id defined herein as being the reconstructed two- or three-dimensional visualization of anatomic data contained within the medical imaging data. This visualization can be performed using a computer.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DESCRIPTION OF EMBODIMENTS

Like numbered elements in these figures are either equivalent elements or perform the same function. Elements which have been discussed previously will not necessarily be discussed in later figures if the function is equivalent.

Figure 1:
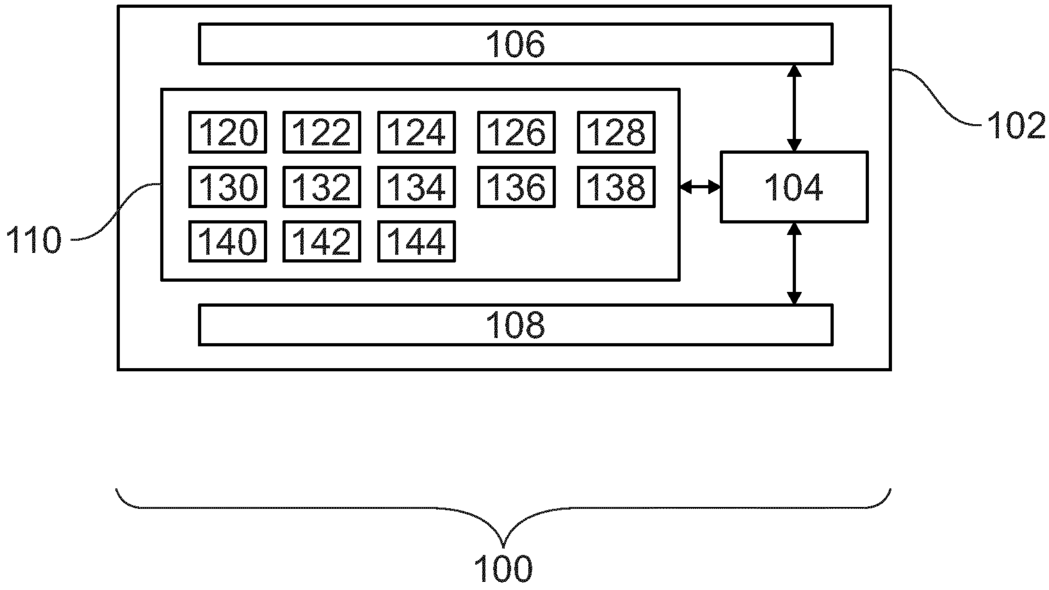
FIG. 1 illustrates an example of a medical system.

FIG. 1 illustrates an example of a medical system 100. The medical system 100 comprises, in this example, a computer 102. The medical system 100 as illustrated in FIG. 1 could be incorporated into different types of situations and used differently. In one example, the medical system may be available online or as a cloud service to perform image processing tasks. In another embodiment the medical system may be incorporated into a workstation used by a radiologist or other medical professional. In yet another example the medical system 100 may be incorporated into a magnetic resonance imaging system.

The medical system is further shown as comprising a computational system 104 that is in communication with an optional hardware interface 106, an optional user interface 108, and a memory 110. The computer 102 is intended to represent one or more computers that may be located at one or more locations. Likewise, the computational system 104 is intended to represent one or more computational systems or processors that may be contained within one or more computing systems. For example, the computer 102 and the computational system 104 could be part of a distributed computing system.

The memory 110 is intended to represent various types of memory which may be accessible to the computational system 104. The memory 110 is shown as containing machine-executable instructions 120. The machine-executable instructions 120 contain instructions which enable the computational system 104 to perform various image processing and magnetic resonance imaging reconstruction tasks. In some examples the machine-executable instructions 120 may also enable the computational system 104 to control a magnetic resonance imaging system via the hardware interface 106. The memory 110 is further shown as containing multi-echo gradient echo k-space data 122. The memory 110 is further shown as containing in-phase groups of k-space data 124 that have been formed from the multi-echo gradient echo k-space data 122. The in-phase groups of k-space data 124 are groups of k-space data that were acquired at particular echo times that are multiples of an interval of when both water and fat are in-phase with each other.

The memory 110 is further shown as containing reference scan k-space data 126. The memory 110 is further shown as containing preliminary magnetic resonance images 128 where there is one image for each of the in-phase groups of k-space data 124. The memory 110 is further shown as containing an average magnetic resonance image 130 that has been constructed by averaging some or all of the preliminary magnetic resonance images 128. The memory 110 is further shown as containing a temporary magnetic resonance image 132. The temporary magnetic resonance image 132 may for example simply be the preliminary magnetic resonance image with the longest echo time that is a multiple of the in-phase period for water and fat. In other examples it may be an average of several images such as the last several images with the longest echo time. The memory 110 is further shown as containing an intermediate magnetic resonance image 134.

The intermediate magnetic resonance image 134 is constructed by subtracting the average magnetic resonance image 130 from the temporary magnetic resonance image 132. The memory 110 is further shown as containing a reference scan magnetic resonance image 136 that is reconstructed from the reference scan k-space data 126. The memory 110 is further shown as containing an image registration 138 between the intermediate magnetic resonance image 134 and the reference scan magnetic resonance image 136. The intermediate magnetic resonance image 134 and the reference scan magnetic resonance image 136 may for example have a different resolution, for example if the reference scan magnetic resonance image 136 is a scout or survey image. The image registration 138 may then serve as a mapping between the two images 134, 136.

The memory 110 is further shown as containing an optional image segmentation algorithm 140. The image segmentation algorithm 140 enables the subject mask 142 to be constructed from the reference scan magnetic resonance image 136. For example, the subject mask 142 may divide voxels into either showing part of the subject or not showing part of the subject. The image registration 138 may for example be performed by the machine-executable instructions 120 using standard image registration techniques. The memory 110 is further shown as containing a clinical magnetic resonance image 144 that was constructed by taking the intermediate magnetic resonance image 134 and using the subject mask 142 to set voxels that are outside or not part of the subject to a predetermined background value such as a zero or null value.

Figure 2:
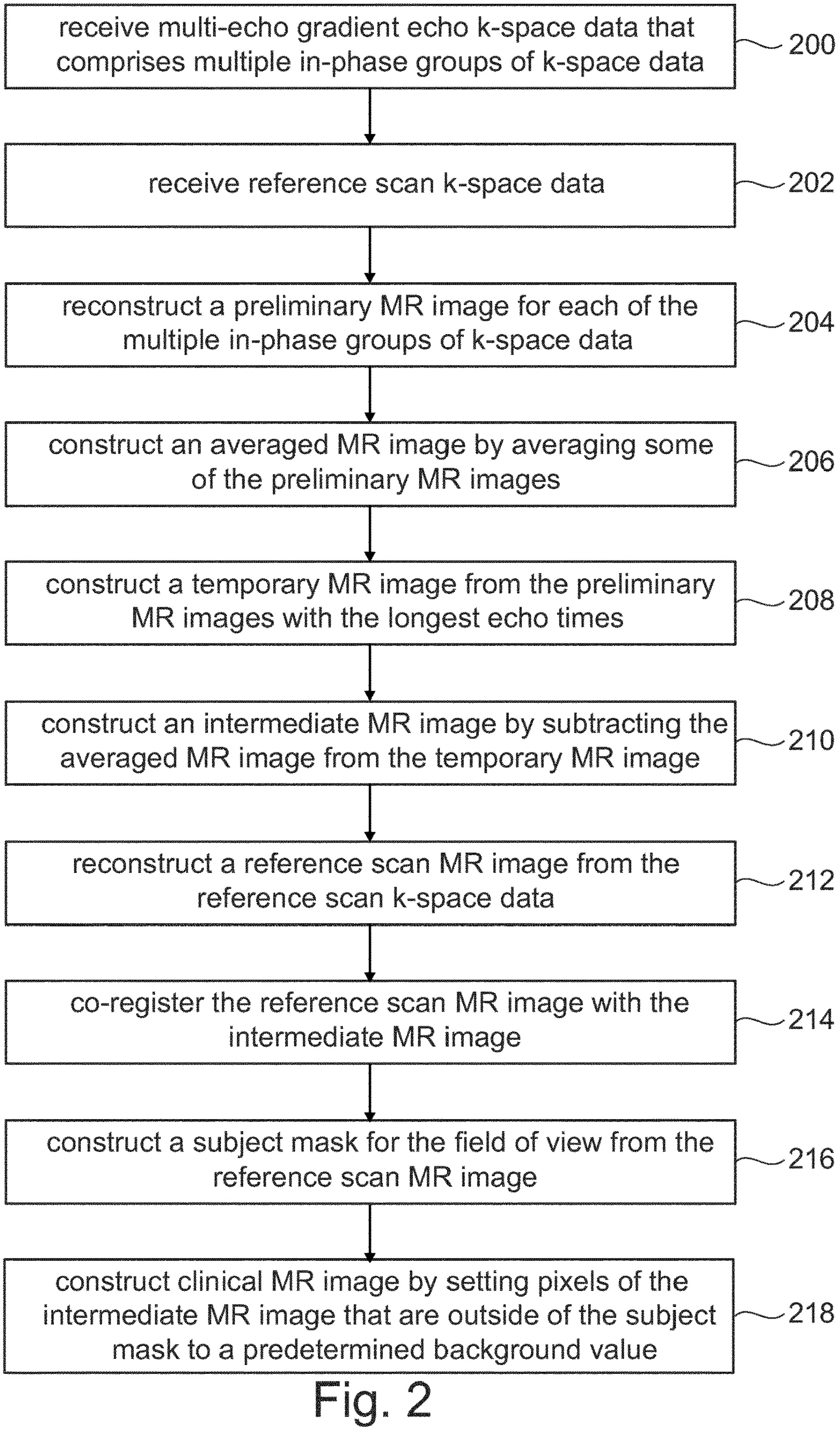
FIG. 2 shows a flow chart which illustrates a method of using the medical system of FIG. 1.

FIG. 2 shows a flowchart which illustrates a method of operating the medical system 100 of FIG. 1. First, in step 200, the multi-echo gradient echo k-space data that is descriptive of a field of view of the subject is received 200. The multi-echo gradient echo k-space data comprises multiple in-phase groups of k-space data acquired at echo times that are multiples of an interval when water and fat are both in-phase. Next, in step 202, the reference scan k-space data 126, that is descriptive of the field of view of the subject, is received. Then, in step 204, the preliminary magnetic resonance image 128 for each of the multiple in-phase groups of k-space data 124 is reconstructed. Then, in step 206, an averaged magnetic resonance image 130 is constructed by averaging at least half of the preliminary magnetic resonance images. Next, in step 208, the temporary magnetic resonance image 132 is constructed by using the preliminary magnetic resonance image of the longest echo time or by averaging less than half of the preliminary magnetic resonance images. Preferably these less than half of the preliminary magnetic resonance images are the preliminary magnetic resonance images with the longest echo time. Then, in step 210, the intermediate magnetic resonance image 134 is constructed by subtracting the average magnetic resonance image from the temporary magnetic resonance image.

Next, in step 212, the reference scan magnetic resonance image 136 is reconstructed from the reference scan k-space data 126. Then, in step 204, the reference scan magnetic resonance image 136 and the intermediate magnetic resonance image 134 are co-registered. Next, in step 216, a subject mask 142 is constructed for the field of view from the reference scan magnetic resonance image. Then finally, in step 218, the clinical magnetic resonance image 144 is constructed by setting pixels of the intermediate magnetic resonance image that are outside of the subject mask to the predetermined background value.

Figure 3:
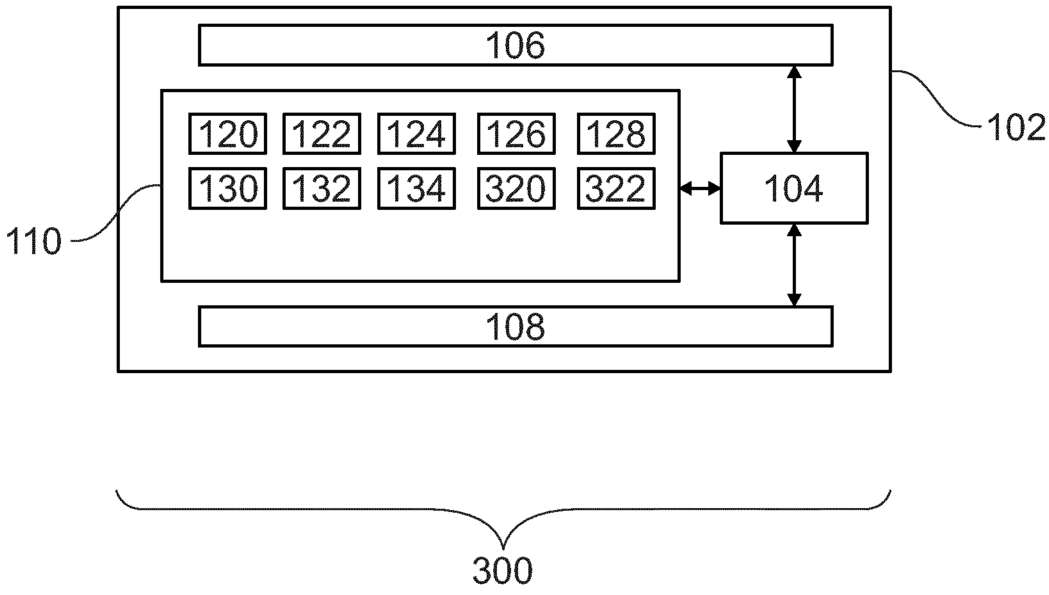
FIG. 3 illustrates a further example of a medical system.

FIG. 3 illustrates a further example of a medical system 300. The medical system 300 depicted in FIG. 3 is similar to the medical system 100 depicted in FIG. 1. In some examples the features of the medical system 100 and 300 may be combined together. In the example in FIG. 3 the multi-echo gradient echo k-space data 122 is shown as further comprising a Dixon group of k-space data that was acquired at an echo time according to a Dixon magnetic resonance imaging protocol. If the Dixon magnetic resonance imaging protocol is a two-point Dixon magnetic resonance imaging protocol then there may only be a single Dixon group of k-space data. If the Dixon magnetic resonance imaging protocol is a multi-point Dixon magnetic resonance imaging protocol, then there may be multiple Dixon groups of k-space data 320. The memory 110 is further shown as comprising a Dixon image 322 that was calculated from at least the one Dixon group of k-space data 320 and a portion of the multiple in-phase groups of k-space data.

Figure 4:
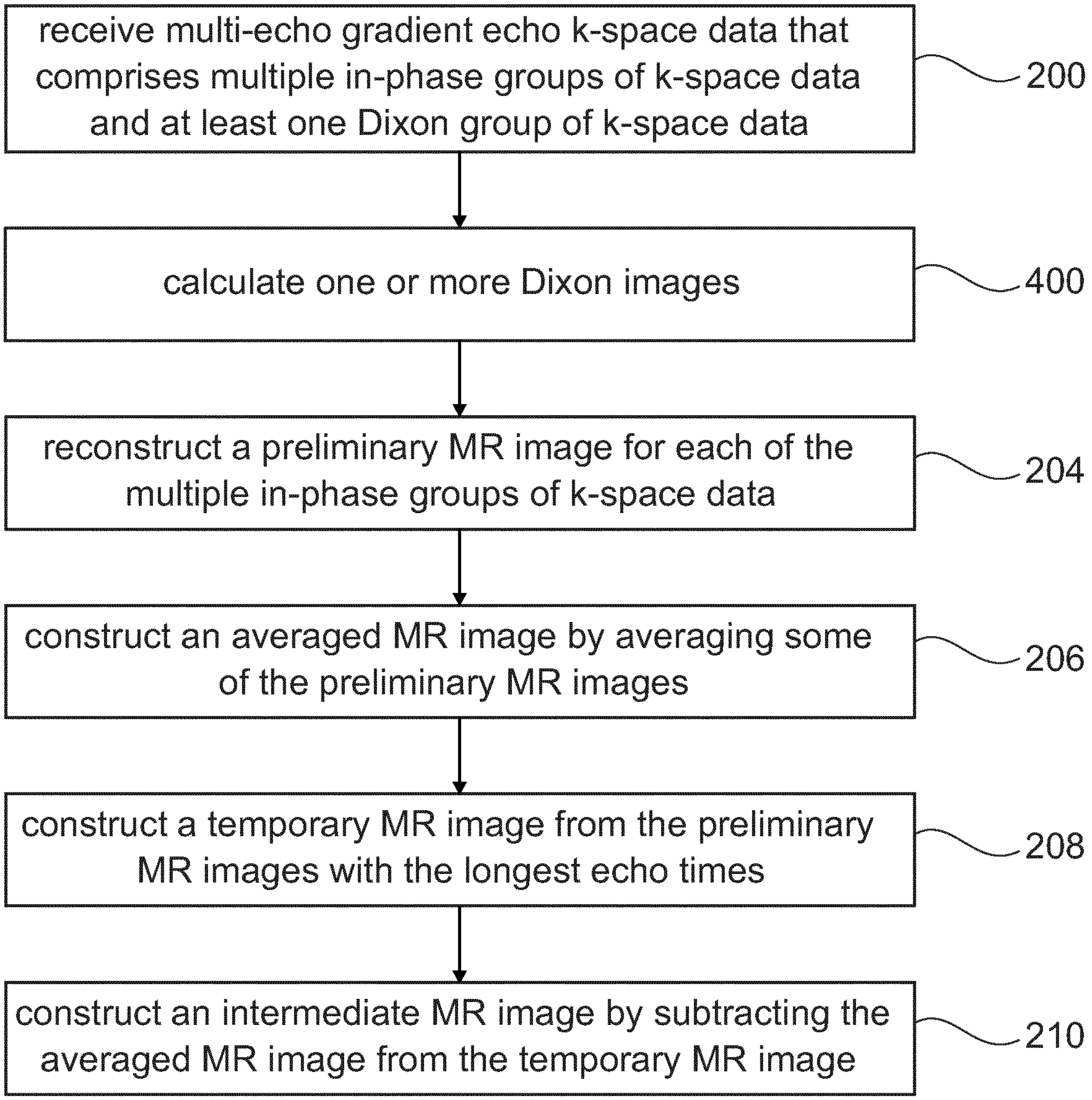
FIG. 4 shows a flow chart which illustrates a method of using the medical system of FIG. 3.

FIG. 4 shows a flowchart which illustrates a method of operating the medical system of FIG. 3. The methods illustrated in FIGS. 2 and 4 may be combined together. In FIG. 4 the method starts with step 200, as illustrated in FIG. 2, and then step 400 is performed. In step 400 one or more Dixon images of the field of view are calculated from at least the one Dixon group of k-space data 320 and a portion of the multiple in-phase groups of k-space data 124. After step 400 is performed, steps 204 through steps 210 are performed as was illustrated in FIG. 2.

Figure 5:
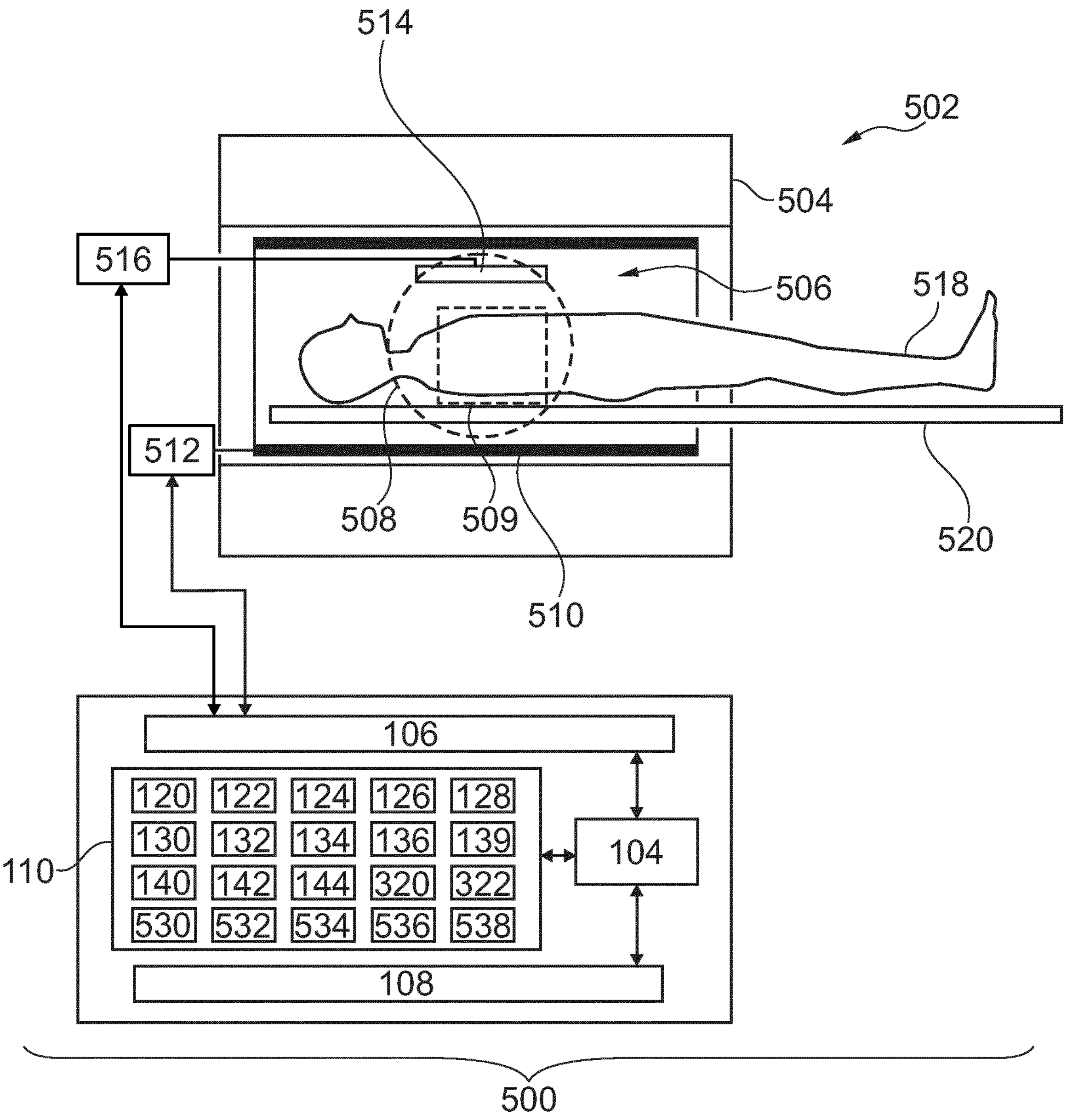
FIG. 5 illustrates a further example of a medical system.

FIG. 5 illustrates a further example of a medical system 500. The example illustrated in FIG. 5 combines the features of the medical systems 100 and 300 illustrated in FIGS. 1 and 3 respectively and additionally comprises a magnetic resonance imaging system 502 that is controlled by the computational system 104.

The magnetic resonance imaging system 502 comprises a magnet 504. The magnet 504 is a superconducting cylindrical type magnet with a bore 506 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 506 of the cylindrical magnet 504 there is an imaging zone 508 where the magnetic field is strong and uniform enough to perform magnetic resonance imaging. A field of view 509 is shown within the imaging zone 508. The k-space data that is acquired typically acquired for the field of view 509. The region of interest could be identical with the field of view 509 or it could be a sub volume of the field of view 509. A subject 518 is shown as being supported by a subject support 520 such that at least a portion of the subject 518 is within the imaging zone 508 and the field of view 509.

Within the bore 506 of the magnet there is also a set of magnetic field gradient coils 510 which is used for acquisition of preliminary k-space data to spatially encode magnetic spins within the imaging zone 508 of the magnet 504. The magnetic field gradient coils 510 connected to a magnetic field gradient coil power supply 512. The magnetic field gradient coils 510 are intended to be representative. Typically magnetic field gradient coils 510 contain three separate sets of coils for spatially encoding in three orthogonal spatial directions. A magnetic field gradient power supply supplies current to the magnetic field gradient coils. The current supplied to the magnetic field gradient coils 510 is controlled as a function of time and may be ramped or pulsed.

Adjacent to the imaging zone 508 is a radio-frequency coil 514 for manipulating the orientations of magnetic spins within the imaging zone 508 and for receiving radio transmissions from spins also within the imaging zone 508. The radio frequency antenna may contain multiple coil elements. The radio frequency antenna may also be referred to as a channel or antenna. The radio-frequency coil 514 is connected to a radio frequency transceiver 516. The radio-frequency coil 514 and radio frequency transceiver 516 may be replaced by separate transmit and receive coils and a separate transmitter and receiver. It is understood that the radio-frequency coil 514 and the radio frequency transceiver 516 are representative. The radio-frequency coil 514 is intended to also represent a dedicated transmit antenna and a dedicated receive antenna. Likewise the transceiver 516 may also represent a separate transmitter and receivers. The radio-frequency coil 514 may also have multiple receive/transmit elements and the radio frequency transceiver 516 may have multiple receive/transmit channels.

The transceiver 516 and the gradient controller 512 are shown as being connected to the hardware interface 106 of the computer system 102. Both of these components, as well as others such as the subject support supplying positional data, may supply the sensor data 126.

The memory 110 is further shown as containing multiple-echo pulse sequence commands 530 that were used to control the magnetic resonance imaging system 502 to acquire the multi-echo gradient echo k-space data 122 that comprise both the in-phase groups of k-space data 124 and the at least one Dixon group of k-space data 320. The memory 110 is shown as further comprising reference scan pulse sequence commands 532 that were used to control the magnetic resonance imaging system to acquire the reference scan k-space data 126.

The memory 110 is shown as optionally containing a computed tomography image processing algorithm 534. This algorithm 534 could take different forms in different examples. In one example, the computed tomography image processing algorithm 534 could receive the clinical magnetic resonance image 144 and do such things as perform a segmentation or do radiation therapy planning using algorithms designed for computed tomography. The memory 110 is further shown as containing a B0 map of the region of interest 509. This may, for example, have been acquired separately or it may have been calculated in the course of performing a multi-point Dixon analysis of the multi-echo gradient echo k-space data 122. In course of performing the Dixon method there may be a T2-star map that was determined. The B0 map 536 and any T2-star map could be used to calculate a T2 map 538. The T2 map 538 may be useful for such things as calculating a cartilage mapping for the clinical image, which may for example be useful in constructing a synthetic computed tomography image.

Computerized tomography (CT) is the ideal modality for imaging bone, but as was mentioned above, the major drawback of CT is its use of ionizing radiation. Radiation exposure is a concern in both adults and children; however, recent studies have shown the risk for developing a radiation-related cancer can be several times higher for children compared to adults exposed to an identical CT. This makes other imaging modalities like MRI that do not use ionizing radiation appealing for pediatric imaging. Although MRI provides excellent soft-tissue contrast it is inferior to CT when imaging bone due to its low proton density and very short T2 relaxation time. The ability to visualize abnormalities in bone with MRI would provide a noninvasive method that would allow for an optimal pediatric imaging strategy for evaluating bone abnormalities and associated soft tissue injuries. Moreover, recent MR imaging methods like synthetic MRI and MR fingerprinting provide multiple MRI contrasts from a single acquisition. These techniques, however, have largely been applied to the brain and only recently started to be applied to other body areas like musculoskeletal. These techniques are also limited to soft-tissue and do not allow for adequate visualization of bone abnormalities.

Examples may utilize a 3D fast field echo (FFE) sequence (or other multi-echo gradient echo technique). The FFE sequence may, in some example, be optimized by using specific and field-dependent echo-spacing. Field-dependent echo-spacing at an in-phase interval (i.e: 2.3 ms, 4.6 ms, etc. @ 3T; 4.6 ms, 9.2 ms, etc. @ 1.5 T) minimizes the chemical shift between fat and water and loss of MR signal due to T2* decay. By adding an echo in the multi-echo acquisition at an echo time (TE) that satisfies the requirement for a two-point Dixon or multi-point Dixon (mDIXON) technique the acquisition can be run through an mDIXON Quant reconstruction pipeline (or other reconstruction technique) to provide in-phase, out of phase, fat, water images and T2*, R2*, fat-fraction, and B0 maps. Furthermore, the use of a flyback gradient and full echo acquisition may offer improvement also. Implementation of flyback gradient may reduce the distortion between echoes due to the constant polarity of the readout gradient for each TE. This reduces blurring when the echoes are summed during the post-processing. Use of a full echo compare to a partial echo improves SNR and reduces image blurring by eliminating partial Fourier of k-space. The B0 and T2* maps can also be used to derive a computed T2 map to provide a full complement of cartilage mapping options.

Following image acquisition, the post-processing steps may include an automated summation of all echoes to increase signal with that resultant image then being subtracted from the last echo to invert the window to produce am image with CT/X-ray like contrast. This inverted image provides the CT/X-ray contrast but creates an image with a white background which is unlike CT and X-ray images. To create a black background the SENSE or other reference scan may be used as a mask. This is done by multiplying the pixels within the SENSE reference scan volume of interest (VOI) contributing to MR signal by 1 and those pixels outside the VOI by 0 to create black background. To further expand on post-processing automated T2*/T2 cartilage maps can be generated by thresholding the quantitative maps which are added as an overlay on any of the magnitude images. It is also possible to add an artificial intelligence (AI) segmentation to allow for segmentation of bone, cartilage, tendon/ligament, muscle, and fat to allow for 3D printing and modelling for surgical preparation.

Figure 6:
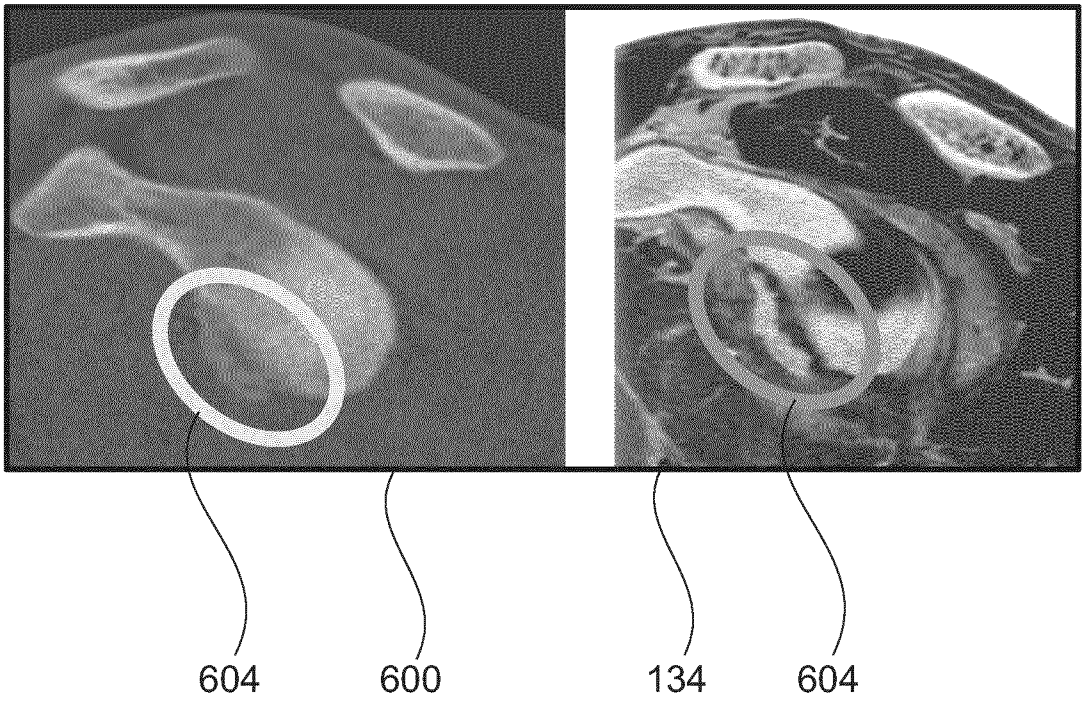
FIG. 6 shows a comparison between a computer tomography image and an intermediate clinical magnetic resonance image.

FIG. 6 shows two medical images. Image 600 is a sagittal computed tomography image that is from a multiplanar reconstruction that shows an anterior clinoid fracture 604. Image 134 shows an intermediate magnetic resonance image constructed according to an example. Within this image, the anterior clinoid fracture 604 is also visible. The comparison of these two images illustrates how the intermediate magnetic resonance image 134 contain similar information to computed tomography images 600. FIG. 6 also illustrates how the background (or areas outside of the subject) have the wrong value. In a CT image, such as is shown in image 600, the background is dark.

Figure 7:
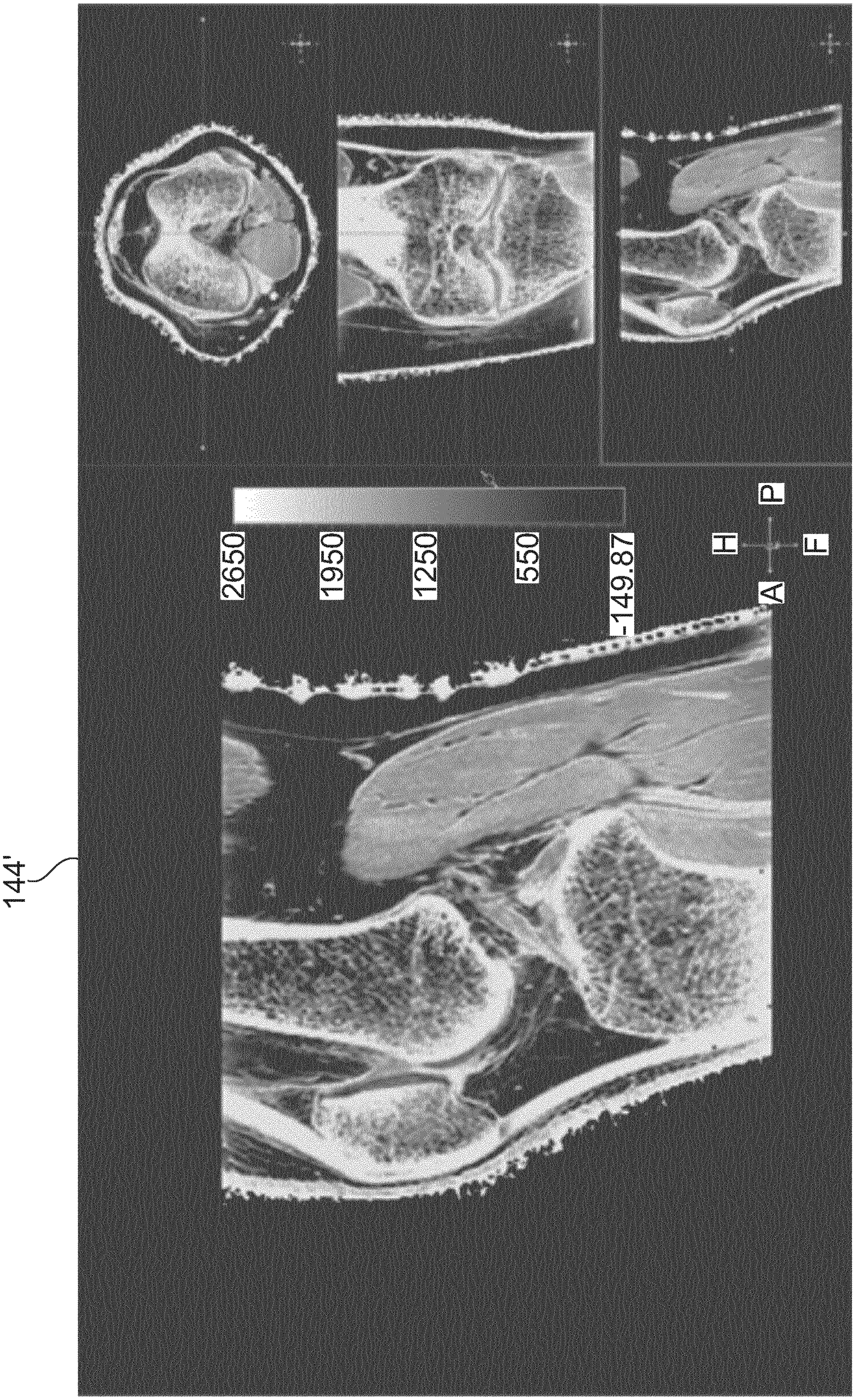
FIG. 7 shows an example of a clinical magnetic resonance image.

FIG. 7 illustrates a further example of a clinical magnetic resonance image 144'. It is striking how this magnetic resonance image 144' contains similar information to a computed tomography image. The background is dark in this example.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

Various embodiments may possibly be described by one or more of the following features specified in the following numbered clauses:

Clause 1. A feature comprising a medical system, the medical system comprising:

a memory storing machine executable instructions, a computational system, wherein execution of the machine executable instructions causes the computational system to:

receive multi-echo gradient echo k-space data descriptive of a field of view of a subject, wherein the multi-echo gradient echo k-space data comprises multiple in-phase groups of k-space data acquired at echo times that are multiples of an interval where water and fat are in phase, wherein the multi-echo gradient echo k-space data further comprises at least one Dixon group of k-space data acquired at an echo time according to a Dixon magnetic resonance imaging protocol;

calculate one or more Dixon images of the field of view from the at least one Dixon group of k-space data and a portion of the multiple in-phase groups of k-space data, wherein the one or more Dixon images comprise one or more of the following: an in phase Dixon image, an out of phase Dixon image, a fat image, a water image, a fat fraction image, a water fraction image, a T2-star map, and an R2-star map;

reconstruct a preliminary magnetic resonance image for each of the multiple in-phase groups of k-space data;

construct an averaged magnetic resonance image by averaging at least half of the preliminary magnetic resonance images;

construct a temporary magnetic resonance image by using the preliminary magnetic resonance image with the longest echo time or by averaging less than half of the preliminary magnetic resonance images; and construct an intermediate magnetic resonance image by subtracting the average magnetic resonance image from the temporary magnetic resonance image.

Clause 2. The medical system of clause 1, wherein execution of the machine executable instructions further causes the computational system to:

receive reference scan k-space data descriptive of the field of view of a subject;

reconstruct a reference scan magnetic resonance image from the reference scan k-space data;

co-register the reference scan magnetic resonance image to the intermediate magnetic resonance image;

construct a subject mask for the field of view from the reference scan magnetic resonance image;

construct a clinical magnetic resonance image by setting pixels of the intermediate magnetic resonance image that are outside of the subject mask to a predetermined background value.

Clause 3. The medical system of clause 2, wherein execution of the machine executable instructions further causes the computational system to input the clinical magnetic resonance image into a computed tomography image processing algorithm, wherein the computed tomography image processing algorithm is anyone of the following: a computed tomography segmentation algorithm, a computed tomography radiotherapy planning algorithm, and a pseudo compute tomography reconstruction algorithm.

Clause 4. The medical system of clause 1, 2, or 3, wherein the Dixon magnetic resonance imaging protocol is a multi-point Dixon magnetic resonance imaging protocol, wherein execution of the machine executable instructions further causes the computational system to calculate a $B_0$ map for the field of view during calculation of the one or more Dixon images.

Clause 5. The medical system of clause 1, 2, or 3, wherein the Dixon magnetic resonance imaging protocol is a two-point Dixon magnetic resonance imaging protocol, wherein execution of the machine executable instructions further causes the computational system to receive a $B_0$ map of the field of view, wherein one or more Dixon images are further calculated using the $B_0$ map.

Clause 6. The medical system of clause 4 or 5, wherein execution of the machine executable instructions further causes the computational system to calculate a T2 map from the T2-star map and the $B_0$ map.

Clause 7. The medical system of clause 6, wherein execution of the machine executable instructions further causes the computational system to calculate a cartilage map for the field of view by segmenting the T2 map.

Clause 8. The medical system of any one of clauses 1 through 7, wherein the medical system further comprises a magnetic resonance imaging system, wherein the memory further contains multiple-echo pulse sequence commands configured to control the magnetic resonance imaging system to acquire the multi-echo gradient echo k-space data, wherein the multiple-echo pulse sequence commands are further configured to additionally control the magnetic resonance imaging system to acquire the multi-echo gradient echo k-space data such that it comprises the at least one Dixon group of k-space data, wherein the memory further contains reference scan pulse sequence commands configured to control the magnetic resonance imaging system to acquire the reference scan k-space data, wherein execution of the machine executable instructions further causes the computational system to:

control the magnetic resonance imaging system with the pulse sequence commands to acquire multi-echo gradient echo k-space data; and control the magnetic resonance imaging system with the reference scan pulse sequence commands to acquire the reference scan k-space data.

Clause 9. The medical system of clause 8, wherein the multiple-echo pulse sequence commands cause the magnetic resonance imaging system to generate flyback magnetic field gradients or bipolar magnetic field gradients to ensure each of the multiple in-phase groups of k-space data and the at least one Dixon group of k-space data are acquired with an identical readout polarity.

Clause 10. The medical system of clause 8 or 9, wherein the multiple-echo pulse sequence commands are configured to control the magnetic resonance imaging system to acquire the multiple in-phase groups of k-space data at echo times that are multiples of an interval of when the water and fat are in phase, wherein the multiple-echo pulse sequence commands are further configured to additionally control the magnetic resonance imaging system to acquire the multi-echo gradient echo k-space data such that it comprises the at least one Dixon group of k-space data.

Clause 11. A feature comprising a computer program product, the computer program product comprising machine executable instructions for execution by a computational system, wherein execution of the machine executable instructions causes the computational system to:

receive multi-echo gradient echo k-space data descriptive of a field of view of a subject, wherein the multi-echo gradient echo k-space data comprises multiple in-phase groups of k-space data acquired at echo times that are multiples of an interval where water and fat are in phase, wherein the multi-echo gradient echo k-space data further comprises at least one Dixon group of k-space data acquired at an echo time according to a Dixon magnetic resonance imaging protocol;

calculate one or more Dixon images of the field of view from the at least one Dixon group of k-space data and a portion of the multiple in-phase groups of k-space data, wherein the one or more Dixon images comprise one or more of the following: an in phase Dixon image, an out of phase Dixon image, a fat image, a water image, a fat fraction image, a water fraction image, a T2-star map, and an R2-star map;

reconstruct a preliminary magnetic resonance image for each of the multiple in-phase groups of k-space data;

construct an averaged magnetic resonance image by averaging at least half of the preliminary magnetic resonance images;

construct a temporary magnetic resonance image by using the preliminary magnetic resonance image with the longest echo time or by averaging less than half of the preliminary magnetic resonance images; and construct an intermediate magnetic resonance image by subtracting the average magnetic resonance image from the temporary magnetic resonance image.

Clause 12. A feature comprising a method of medical imaging, wherein the method comprises:

receiving multi-echo gradient echo k-space data descriptive of a field of view of a subject, wherein the multi-echo gradient echo k-space data comprises multiple in-phase groups of k-space data acquired at echo times that are multiples of an interval where water and fat are in phase, wherein the multi-echo gradient echo k-space data further comprises at least one Dixon group of k-space data acquired at an echo time according to a Dixon magnetic resonance imaging protocol;

calculating one or more Dixon images of the field of view from the at least one Dixon group of k-space data and a portion of the multiple in-phase groups of k-space data, wherein the one or more Dixon images comprise one or more of the following: an in phase Dixon image, an out of phase Dixon image, a fat image, a water image, a fat fraction image, a water fraction image, a T2-star map, and an R2-star map;

reconstructing a preliminary magnetic resonance image for each of the multiple in-phase groups of k-space data;

constructing an averaged magnetic resonance image by averaging at least half of the preliminary magnetic resonance images;

constructing a temporary magnetic resonance image by using the preliminary magnetic resonance image with the longest echo time or by averaging less than half of the preliminary magnetic resonance images; and constructing an intermediate magnetic resonance image by subtracting the average magnetic resonance image from the temporary magnetic resonance image.

REFERENCE SIGNS LIST

100 medical system
102 computer
104 computational system
106 hardware interface
108 user interface
110 memory
120 machine executable instructions
122 multi-echo gradient echo k-space data
124 in-phase groups of k-space data
126 reference scan k-space data
128 preliminary magnetic resonance images
130 averaged magnetic resonance image
132 temporary magnetic resonance image
134 intermediate magnetic resonance image
136 reference scan magnetic resonance image
138 image registration
140 image segmentation algorithm
142 subject mask
144 clinical magnetic resonance image
144' clinical magnetic resonance image
200 receive multi-echo gradient echo k-space data descriptive of a field of view of a subject, wherein the multi-echo gradient echo k-space data multiple in-phase groups of k-space data acquired at echo times that are multiples of an interval when water and fat are in phase
202 receive reference scan k-space data descriptive of the field of view of the subject
204 reconstruct a preliminary magnetic resonance image for each of the multiple in-phase groups of k-space data
206 construct an averaged magnetic resonance image by averaging at least half of the preliminary magnetic resonance images
208 construct a temporary magnetic resonance image by using the preliminary magnetic resonance image with the longest echo time or by averaging less than half of the preliminary magnetic resonance images
210 construct an intermediate magnetic resonance image by subtracting the average magnetic resonance image from the temporary magnetic resonance image
212 reconstruct a reference scan magnetic resonance image from the reference scan k-space data
214 co-register the reference scan magnetic resonance image to the intermediate magnetic resonance image
216 construct a subject mask for the field of view from the reference scan magnetic resonance image
218 construct a clinical magnetic resonance image by setting pixels of the intermediate magnetic resonance image that are outside of the subject mask to a predetermined background value
300 medical system
320 Dixon group of k-space data
322 Dixon image
400 calculate one or more Dixon images of the field of view from the at least one Dixon group of k-space data and a portion of the multiple in-phase groups of k-space data
500 medical system
502 magnetic resonance imaging system
504 magnet
506 bore of magnet
508 imaging zone
509 field of view
510 magnetic field gradient coils
512 magnetic field gradient coil power supply
514 radio-frequency coil
516 transceiver
518 subject
520 subject support
530 multiple-echo pulse sequence commands
532 reference scan pulse sequence commands
534 computed tomography image processing algorithm
536 B0 map
538 T2 map
600 sagittal computed tomography multiplanar reconstruction
604 anterior glenoid fracture

The invention claimed is:

1. A medical system comprising:

a memory storing machine executable instructions, a computational system, wherein execution of the machine executable instructions causes the computational system to:

receive multi-echo gradient echo k-space data descriptive of a field of view of a subject, wherein the multi-echo gradient echo k-space data comprises multiple in-phase groups of k-space data acquired at echo times that are multiples of an interval where water and fat are in phase, wherein the multi-echo gradient echo k-space data further comprises at least one Dixon group of k-space data acquired at an echo time according to a Dixon magnetic resonance imaging protocol;

calculate one or more Dixon images of the field of view from the at least one Dixon group of k-space data and a portion of the multiple in-phase groups of k-space data, wherein the one or more Dixon images comprise one or more of the following: an in phase Dixon image, an out of phase Dixon image, a fat image, a water image, a fat fraction image, a water fraction image, a T2-star map, and an R2-star map;

reconstruct a preliminary magnetic resonance image for each of the multiple in-phase groups of k-space data;

construct an averaged magnetic resonance image by averaging at least half of the preliminary magnetic resonance images;

construct a temporary magnetic resonance image by using the preliminary magnetic resonance image with the longest echo time or by averaging less than half of the preliminary magnetic resonance images with the longest echo times; and construct a subtracted magnetic resonance image by subtracting the average magnetic resonance image from the temporary magnetic resonance image.

2. The medical system of claim 1, wherein execution of the machine executable instructions further causes the computational system to:

receive reference scan k-space data descriptive of the field of view of a subject;

reconstruct a reference scan magnetic resonance image from the reference scan k-space data;

co-register the reference scan magnetic resonance image to the subtracted magnetic resonance image;

construct a subject mask for the field of view from the reference scan magnetic resonance image;

construct a clinical magnetic resonance image by setting pixels of the intermediate subtracted magnetic resonance image that are outside of the subject mask to a predetermined background value.

3. The medical system of claim 2, wherein execution of the machine executable instructions further causes the computational system to input the clinical magnetic resonance image into a computed tomography image processing algorithm, wherein the computed tomography image processing algorithm is anyone of the following: a computed tomography segmentation algorithm, a computed tomography radiotherapy planning algorithm, and a pseudo computed tomography reconstruction algorithm.

4. The medical system of claim 2, wherein the Dixon magnetic resonance imaging protocol is a multi-point Dixon magnetic resonance imaging protocol, wherein execution of the machine executable instructions further causes the computational system to calculate a $B_0$ map for the field of view during calculation of the one or more Dixon images.

5. The medical system of claim 2, wherein the Dixon magnetic resonance imaging protocol is a two-point Dixon magnetic resonance imaging protocol, wherein execution of the machine executable instructions further causes the computational system to receive a $B_0$ map of the field of view, wherein one or more Dixon images are further calculated using the $B_0$ map.

6. The medical system of claim 4, wherein execution of the machine executable instructions further causes the computational system to calculate a T2 map from the T2-star map and the $B_0$ map.

7. The medical system of claim 6, wherein execution of the machine executable instructions further causes the computational system to calculate a cartilage map for the field of view by segmenting the T2 map.

8. The medical system of claim 1, wherein the medical system further comprises a magnetic resonance imaging system, wherein the memory further contains multiple-echo pulse sequence commands configured to control the magnetic resonance imaging system to acquire the multi-echo gradient echo k-space data, wherein the memory further contains reference scan pulse sequence commands configured to control the magnetic resonance imaging system to acquire the reference scan k-space data, wherein execution of the machine executable instructions further causes the computational system to:

control the magnetic resonance imaging system with the pulse sequence commands to acquire multi-echo gradient echo k-space data; and control the magnetic resonance imaging system with the reference scan pulse sequence commands to acquire the reference scan k-space data.

9. The medical system of claim 8, wherein the multiple-echo pulse sequence commands cause the magnetic resonance imaging system to generate fly back magnetic field gradients or bipolar magnetic field gradients to ensure each of the multi-echo gradient echo k-space data is acquired with an identical readout polarity.

10. The medical system of claim 8, wherein the multiple-echo pulse sequence commands are gradient echo pulse sequence commands configured to control the magnetic resonance imaging system to acquire the multi-echo gradient echo k-space data at echo times that are multiples of the interval of when the fat and water are in phase wherein the multiple-echo pulse sequence commands are further configured to additionally control the magnetic resonance imaging system to acquire the multi-echo gradient echo k-space data such that it comprises the at least one Dixon group of k-space.

11. A non-transitory computer program product comprising:

machine executable instructions to be executed by a computational system-, wherein execution of the machine executable instructions cause the computational system to:

receive multi-echo gradient echo k-space data descriptive of a field of view of a subject wherein the multi-echo gradient echo k-space data comprises multiple in-phase groups of k-space data acquired at echo times that are multiples of an interval when water and fat are in phase;

wherein the multi-echo gradient echo k-space data further comprises at least one Dixon group of k-space data acquired at an echo time according to a Dixon magnetic resonance imaging protocol;

calculate one or more Dixon images of the field of view from the at least one Dixon group of k-space data and a portion of the multiple in-phase groups of k-space data, wherein the one or more Dixon images comprise one or more of the following: an in phase Dixon image, an out of phase Dixon image, a fat image, a water image, a fat fraction image, a water fraction image, a T2-star map, and an R2-star map;

reconstruct a preliminary magnetic resonance image for each of the multiple in-phase groups of k-space data;

construct an averaged magnetic resonance image by averaging at least half of the preliminary magnetic resonance images;

construct a temporary magnetic resonance image by using the preliminary magnetic resonance image with the longest echo time or by averaging less than half of the preliminary magnetic resonance images with the longest echo times; and;

construct a subtracted magnetic resonance image by subtracting the average magnetic resonance image from the temporary magnetic resonance image.

12. A method of medical imaging, wherein the method comprises:

receiving multi-echo gradient echo k-space data descriptive of a field of view of a subject, wherein the multi-echo gradient echo k-space data comprises multiple in-phase groups of k-space data acquired at echo times that are multiples of an interval when water and fat are in phase;

wherein the multi-echo gradient echo k-space data further comprises at least one Dixon group of k-space data acquired at an echo time according to a Dixon magnetic resonance imaging protocol;

calculating one or more Dixon images of the field of view from the at least one Dixon group of k-space data and a portion of the multiple in-phase groups of k-space data, wherein the one or more Dixon images comprise one or more of the following: an in phase Dixon image, an out of phase Dixon image, a fat image, a water image, a fat fraction image, a water fraction image, a T2-star map, and an R2-star map;

reconstructing a preliminary magnetic resonance image for each of the multiple in-phase groups of k-space data;

constructing an averaged magnetic resonance image by averaging at least half of the preliminary magnetic resonance images;

constructing a temporary magnetic resonance image by using the preliminary magnetic resonance image with the longest echo time or by averaging less than half of the preliminary magnetic resonance images with the longest echo times; and;

constructing a subtracted magnetic resonance image by subtracting the average magnetic resonance image from the temporary magnetic resonance image.

* * * * *